United States Patent [19]

Polinski, Sr.

[11] Patent Number: 5,386,339
[45] Date of Patent: Jan. 31, 1995

[54] MONOLITHIC MICROELECTRONIC CIRCUIT PACKAGE INCLUDING LOW-TEMPERATURE-COFIRED-CERAMIC (LTCC) TAPE DIELECTRIC STRUCTURE AND IN-SITU HEAT SINK

[75] Inventor: Paul W. Polinski, Sr., Dana Point, Calif.

[73] Assignee: Hughes Aircraft Company, Los Angeles, Calif.

[21] Appl. No.: 98,996

[22] Filed: Jul. 29, 1993

[51] Int. Cl.⁶ .............................................. H05K 7/20
[52] U.S. Cl. ................................. 361/719; 174/252; 257/700; 257/720; 361/749; 361/795
[58] Field of Search .............. 361/761, 762, 764, 792, 361/795, 749–751, 704, 705, 707, 712, 713, 718–720, 722; 257/700, 705–707, 720, 713; 174/16.3, 252; 165/80.3, 185

[56] References Cited

U.S. PATENT DOCUMENTS

| | | | |
|---|---|---|---|
| 4,860,165 | 8/1989 | Cassinelli | 361/388 |
| 4,899,118 | 2/1990 | Polinski, Sr. | |
| 4,967,201 | 10/1990 | Rich, III | 342/175 |
| 5,012,386 | 4/1991 | McShane | 361/386 |
| 5,045,921 | 9/1991 | Lin | 357/74 |
| 5,130,768 | 7/1992 | Wu | 357/82 |
| 5,285,352 | 2/1994 | Pastore | 361/707 |

OTHER PUBLICATIONS

Development of a Low Temperature Cofired Multilayer Ceramic Technology, by W. Vitriol et al., ISHM Proceedings 1983, pp. 593–598.

Primary Examiner—Gerald P. Tolin
Attorney, Agent, or Firm—Elizabeth E. Leitereg; Terje Gudmestad; W. K. Denson-Low

[57] ABSTRACT

A dielectric structure (12) includes a plurality of stacked sheets (16) of low thermal conductivity, low-temperature-cofired-ceramic (LTCC) tape formed with a hole (18) therethrough. A heat sink (20) includes a plurality of stacked sheets (22) of high thermal conductivity LTCC tape disposed in the hole (18). The high thermal conductivity sheets (22) and the low thermal conductivity sheets (16) are cofired to produce the heat sink (20) as an in-situ element in the dielectric structure (12). A heat generating electrical component (28) is mounted on the heat sink (20) in thermal communication therewith. The dielectric structure (12) is mounted on a high thermal conductivity substrate (24) with the heat sink (20) in thermal communication with the substrate (24) to conduct away heat generated by the component (28). The high thermal conductivity sheets (22) and the substrate (24) can be electrically conductive and electrically communicate with the component (28), or can be electrically insulative.

19 Claims, 3 Drawing Sheets

MONOLITHIC MICROELECTRONIC CIRCUIT PACKAGE INCLUDING LOW-TEMPERATURE-COFIRED-CERAMIC (LTCC) TAPE DIELECTRIC STRUCTURE AND IN-SITU HEAT SINK

BACKGROUND OF THE INVENTION

1. Field of the Invention

The present invention generally relates to the art of Multi-Chip-Module (MCM) circuit structures fabricated from Low-Temperature-Cofired-Ceramic (LTCC) tape, and more specifically to a monolithic microelectronic circuit package including an LTCC dielectric structure and an in-situ heat sink.

2. Description of the Related Art

An MCM package generally includes a monolithic dielectric structure consisting of a number of layers of insulating material which have conductor patterns, resistors and other electrical circuit elements formed on their surfaces. The layers are thermally fused together such that the circuit elements are buried in the structure. Vertical interconnects (vias) are formed through the insulating layers and provide interconnection of circuit elements on adjacent layers.

One or more microelectronic integrated circuit chips, dies, and/or discrete components are mounted on the surface of the dielectric structure, and are connected to the buried elements by wire bonds or other connection methods. In a flip-chip configuration, a surface of an integrated circuit chip or die on which bonding pads are formed faces the dielectric structure, and the bonding pads are connected to mating bonding pads on the dielectric structure by electrically conductive bumps.

LTCC tape is a desirable material for fabrication of MCM dielectric structures, having a material formulation including a mixture of glass and ceramic fillers or recrystallizable glass which sinters at about 850° C., and exhibiting thermal expansion similar to alumina. The low-temperature processing permits the use of air fired resistors and precious metal thick film conductors such as gold, silver, or their alloys. It also allows processing of base metals such as copper in a nitrogen or reducing atmosphere.

A general treatise on LTCC technology is found in an article entitled "DEVELOPMENT OF A LOW TEMPERATURE COFIRED MULTILAYER CERAMIC TECHNOLOGY" by William Vitriol et al ISHM Proceedings 1983, pp. 593–598.

A drawback of conventional LTCC tape is its low thermal conductivity and corresponding inability to dissipate heat generated by high power electrical components. This has conventionally limited the application of LTCC dielectric structures to low power electronic devices which generate relatively small amounts of heat.

A method of providing heat sinking in an LTCC dielectric structure to enable the use of higher power electronic devices is disclosed in my prior U.S. Pat. No. 4,899,118, entitled "LOW TEMPERATURE COFIRED CERAMIC PACKAGES FOR MICROWAVE AND MILLIMETER WAVE GALLIUM ARSENIDE INTEGRATED CIRCUITS", issued Feb. 6, 1990 The heat sink arrangement includes a number of tightly packed, high thermal conductivity, vertically stacked or staggered vias which are formed through an LTCC dielectric structure for conducting heat away from a heat generating component. The heat sink has a thermal conductivity comparable to that of high purity alumina.

Although suitable for numerous applications, the process for fabricating the thermally conductive vias is complicated and expensive, and a large number of vias reduce the durability of the LTCC dielectric structure. The heat sink constituted by the vias is relatively inefficient, since the vias must be laterally separated from each other by portions of the dielectric structure.

SUMMARY OF THE INVENTION

A monolithic microelectronic circuit package embodying the present invention includes a dielectric structure formed of a plurality of stacked sheets of low thermal conductivity LTCC tape. A hole is formed through the dielectric structure.

A heat sink formed of a plurality of stacked sheets of high thermal conductivity LTCC tape is disposed in the hole. The high and low thermal conductivity sheets are cofired to produce the heat sink as an in-situ element in the dielectric structure. The package is hermetically sealed due to the method of fabrication and non-porosity of the LTCC tape.

A heat generating electrical component is mounted on the heat sink, or on the dielectric structure in thermal communication with the heat sink. The dielectric structure is mounted on a high thermal conductivity substrate with the heat sink in thermal communication with the substrate to conduct away heat generated by the component.

The substrate and the high thermal conductivity sheets can be electrically conductive and electrically communicate with the component, or can be electrically insulative.

The heat sink conducts heat away from the component efficiently, thereby enabling the integration of higher power components or devices into an LTCC MCM package than has been previously possible. The high thermal dissipation enables devices to operate at lower temperatures, thereby extending their operating lifetimes and increasing their reliability.

The high thermal conductivity LTCC sheets which constitute the heat sink do not weaken the dielectric structure as do the large number of thermally conductive vias of the prior art. In addition, the present heat sink is a monolithic unit which does not include lateral areas of low thermal conductivity.

A method of fabricating the present monolithic microelectronic circuit package according to the invention includes forming holes through the low thermal conductivity LTCC sheets, and forming the high thermal conductivity LTCC sheets with the same shapes as the respective holes. The sheets are then stacked and laminated together, with the high thermal conductivity sheets which constitute the heat sink disposed in the holes of the low thermal conductivity sheets respectively.

The laminated sheets are then cofired and fused sintered together to form the heat sink as an in-situ element in the dielectric structure. The high and thermal conductivity sheets are formulated to have the same thermal shrinkage characteristics, such that no gaps are formed in the package during firing. The dielectric structure is mounted on the high thermal conductivity substrate, and the microelectronic components are mounted on the dielectric structure.

The present method of fabricating the present microelectronic circuit package is simpler and less expensive than the prior method of fabricating a large number of thermally conductive vias, and produces a heat sink with higher thermal efficiency.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
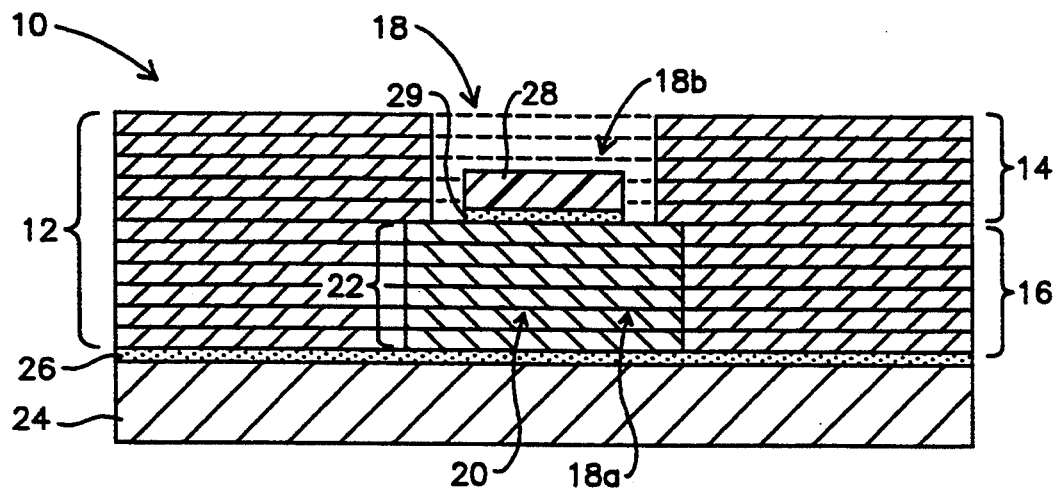
FIGS. 1 to 5 are simplified sectional views illustrating alternative embodiments of a monolithic microelectronic circuit package embodying the present invention.

A monolithic microelectronic MCM circuit package 10 embodying the present invention is illustrated in FIG. 1. The package 10 includes a dielectric structure 12 consisting of a plurality of stacked low thermal conductivity sheets 14 and 16 of LTCC tape, typically DuPont Green Tape ® no. 851AT.

A cavity or hole 18 is formed through the structure 12, having a lower first portion 18a extending through the sheets 16 and an upper second portion 18b extending through the sheets 14. The lower portion 18a is illustrated as being larger than the upper portion 18b, although the invention is not so limited.

A heat sink 20 includes at least one, but preferably a plurality of stacked high thermal conductivity sheets 22 of LTCC tape disposed in the lower portion 18a of the hole 18. The sheets 22 have the same shape as the holes 18a of the sheets 16 such that there are no lateral gaps between the sheets 16 and 22. The sheets 16 and 22 are thermally fused together during fabrication to constitute a unitary mass, with the heat sink 20 being an in-situ element in the dielectric structure 12.

The dielectric structure 12 and heat sink 20 are mounted on a high thermal conductivity substrate 24 formed of aluminum, Kovar, aluminum silicon carbide or other suitable material by epoxy adhesive, soldering, brazing or the like as indicated at 26. A microelectronic component 28 such as an integrated circuit chip or die, or discrete circuit element is similarly mounted on the top of the heat sink 20 as indicated at 29.

The heat sink 20 is illustrated as being thinner than the dielectric structure 12, with the upper portion 18b of the hole 18 in which the component 28 is mounted opening external of the structure 12. However, the invention is not so limited. For example, the heat sink 20 can have the same thickness as the structure 12, with the hole 18 having no open portion.

Although not specifically illustrated, electrically conductive metallization patterns, resistors, inductors and other circuit elements are formed on the individual sheets 14 and 16 of the dielectric structure 12, with the elements on adjacent sheets 14 and 16 being interconnected by vias.

The component 28 is connected to the metallization pattern in the structure 12 by wire bonds or the like (not shown). During fabrication, the sheets 14, 16 and 22 are cofired and thereby thermally fused or sintered together to form a monolithic mass, with the internal circuit elements being buried and hermetically sealed.

The component 28, which is preferably a high power microelectronic integrated circuit, amplifier chip or the like, generates a large amount of heat during operation. The heat sink 20, substrate 24 and adhesives 26 and 29 are formulated of high thermal conductivity materials, such that the component 28 thermally communicates with the substrate 24 through the heat sink 20 and the adhesives 26 and 29. Thus, heat generated by the component 28 is efficiently conducted away by the heat sink 20 and substrate 24, enabling the component 28 to operate at high power and low temperature.

The lower surface of the component 28 is typically formed with an electrically conductive ground plane (not shown) which is maintained at zero potential. The substrate 24 is preferably electrically conductive and maintained at ground potential. The heat sink 20 and adhesives 26 and 29 can be electrically conductive, as well as having high thermal conductivity, to electrically connect the ground plane of the component 28 with the substrate 24 to provide a ground connection for the component 28.

Alternatively, the heat sink 20 can be dielectric to electrically insulate the component 28 from the substrate 24. In this case, a ground connection for the component 28 is made by the wire bonds or the like (not shown) extending between the component 28 and the metallization pattern in the sheets 14 and 16.

The sheets 22 of the heat sink 20 are formed of LTCC tape having the same thermal shrinkage characteristics as the sheets 14 and 16, such that the sheets 14, 16 and 22 shrink integrally upon cofiring and sintering with no lateral gaps being produced between the sheets 16 and 22. The heat sink 20 is therefore hermetically sealed at its edges in-situ in the dielectric structure 12.

The sheets 22 are similar to the sheets 14 and except that they include, in addition to the conventional glass and ceramic fillers and organic binders, a high thermal conductivity additive which is dispersed in the sheet material. Where an electrically conductive heat sink is desired, the additive can be silver, gold or copper powder.

In addition, matrix metals including copper graphite, copper molybdenum, copper tungsten, pure molybdenum, and silgards including silver molybdenum and silver tungsten are suitable for use as electrically conductive additives.

Suitable additives for formulating an electrically insulative heat sink include aluminum nitride, beryllia and diamond.

The high thermal conductivity LTCC sheets 22 which constitute the heat sink 20 do not weaken the dielectric structure 12 as do the large number of thermally conductive vias as used in the prior art. In addition, the present heat sink 20 is a monolithic unit which does not include lateral areas of low thermal conductivity.

Figure 2:
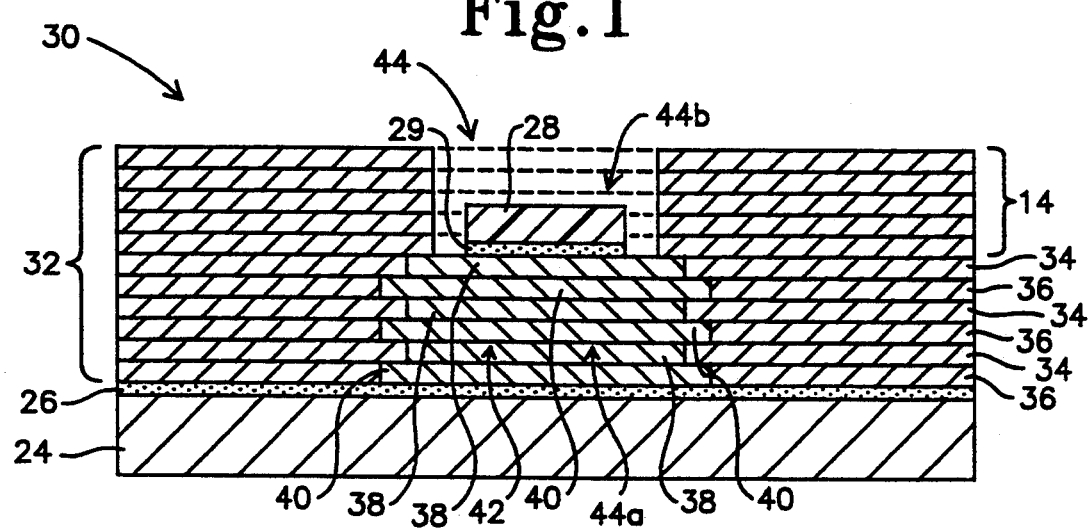

FIG. 2 illustrates a monolithic microelectronic MCM circuit package 30, which differs from the package 10 in that the low thermal conductivity LTCC sheets 16 of the dielectric structure 12 are replaced by low thermal conductivity LTCC sheets 34 and 36 of a dielectric structure 32, and the high thermal conductivity sheets 22 of the heat sink 20 are replaced by high thermal conductivity LTCC sheets 38 and 40 of a heat sink 42.

A hole 44 is formed through the sheets 14, 34 and 36, having a lower portion 44a and an upper portion 44b.

The sheets 38 have lateral shapes which are smaller than the lateral shapes of the sheets 40 and are disposed in holes in the sheets 34 and 36 which have the same shapes as the sheets 38 and 40 respectively.

In this manner, the lower portion 44a of the hole 44 has a zig-zag vertical cross-section of alternating large and small lateral dimension. The arrangement of FIG. 2 is advantageous in that the adjacent edge portions of the sheets 34,36 and 38,40 interlock to increase the structural rigidity and durability of the package 30.

Whereas the sheets 16 and 22 of the package 10 are fused together only at their abutting edges, the sheets 34,36 and 38,40 of the package 30 are additionally fused together at the overlapping horizontal surfaces of their adjacent edge portions. This increases the fusion area of the sheets 34,36 to the sheets 38,40 to further increase the structural rigidity and durability of the package 30.

Figure 3:
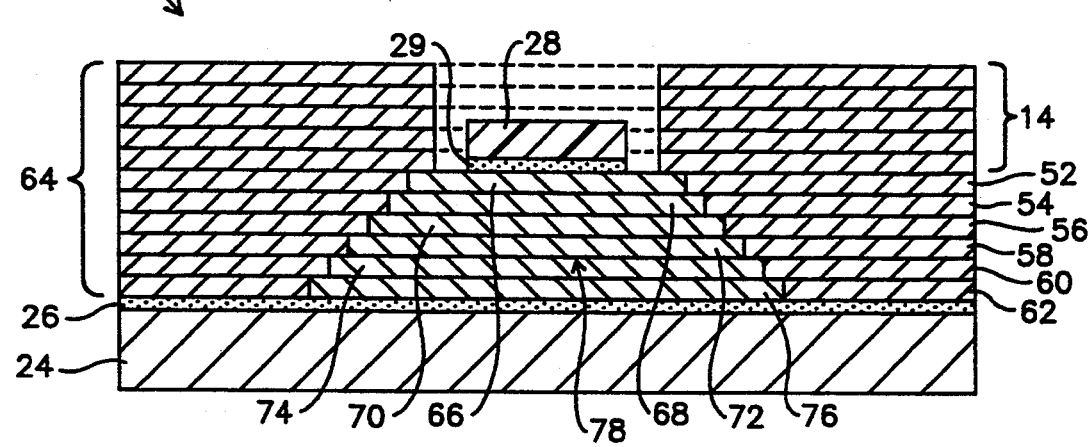

FIG. 3 illustrates a monolithic microelectronic MCM circuit package 50, including low thermal conductivity LTCC sheets 52, 54, 56, 58, 60 and 62 which constitute a dielectric structure 64, and at least one, preferably a plurality of stacked high thermal conductivity sheets 68, 70, 72, 74 and 76 which constitute a heat sink 78.

The lateral sizes of the sheets 66 to 76 and thereby the cross-section of the heat sink 78 progressively increase from the component 28 toward the substrate 24 in a stepped arrangement. This is advantageous in that heat spreads laterally from the component 28 through the heat sink 78 toward the substrate 24, thereby increasing the efficiency with which the heat sink 78 conducts heat away from the component 28.

Figure 4:
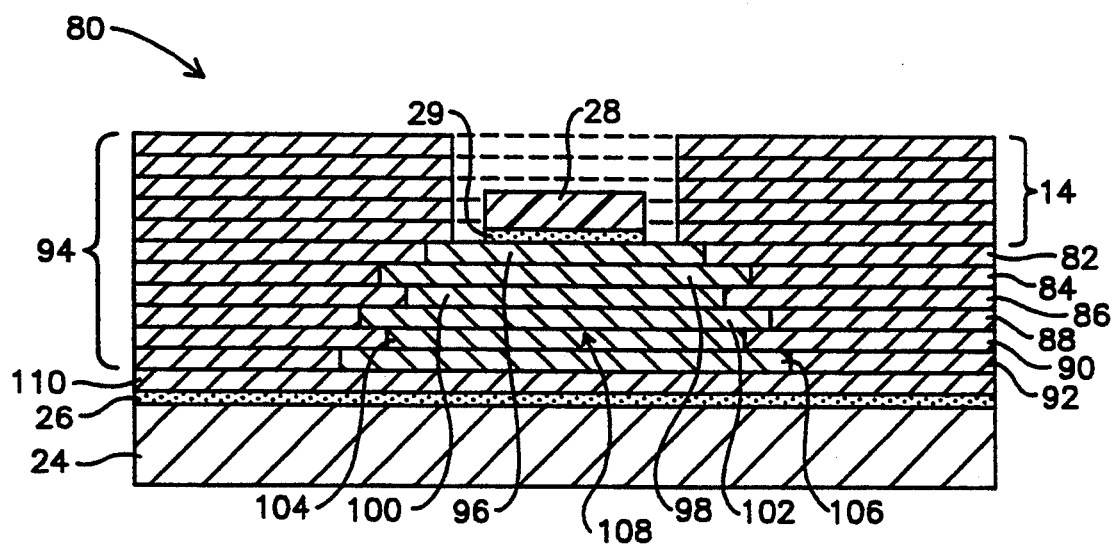

FIG. 4 illustrates a monolithic microelectronic MCM circuit package 80, including low thermal conductivity LTCC sheets 82, 84, 86, 88, 90 and 92 which constitute a dielectric structure 94, and at least one, preferably a plurality of stacked high thermal conductivity LTCC sheets 96, 98, 100, 102, 104 and 106 which constitute a heat sink 108.

The package 80 combines the advantages of the packages 30 and 50, with the vertical cross-section of the heat sink 108 increasing from the component 28 toward the substrate 24, and the edge portions of the sheets 82 to 92 interlocking with the edge portions of the sheets 96 to 106.

An optional LTCC sheet 110 is provided between the bottom sheets 92 and 106 and the substrate 24. The sheet 110 can be electrically conductive to improve the electrical interconnection of the heat sink 108 to the substrate 24. Alternatively, the sheet 110 can be electrically insulative, enabling an electrically conductive heat sink 108 to be used in applications in which the component 28 is required to be electrically insulated from the substrate 24.

Although the component 28 can be electrically connected to the conductive heat sink 108, the sheet 110 will electrically insulate the heat sink 108 and thereby the component 28 from the substrate 24.

The sheet 110 preferably has high thermal conductivity. However, the loss of thermal conductivity caused by a single sheet of conventional low thermal conductivity LTCC tape is not great, and conventional LTCC tape can be used for the sheet 110 if the small loss of thermal efficiency is not critical in a particular application. Although not specifically illustrated, the sheet 110 can also be incorporated into the packages 10, 30 and 50.

Figure 5:
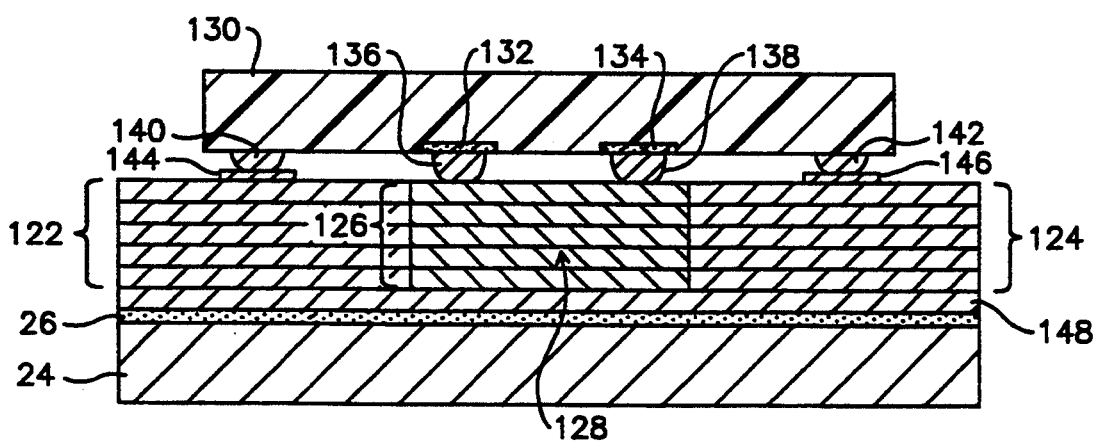

FIG. 5 illustrates a monolithic microelectronic MCM circuit package 120, including low thermal conductivity LTCC sheets 122 which constitute a dielectric structure 124, and at least one, preferably a plurality of stacked high thermal conductivity LTCC sheets 126 which constitute a heat sink 128.

A microelectronic component 130 in the form of a flip-chip integrated circuit is mounted upside-down on the dielectric structure 124, and includes heat generating regions 132 and 134. Typically, the regions 132 and will be the source-gate junctions of high power field-effect transistors (not shown).

The regions 132 and 134 are thermally connected to the heat sink 128 by high thermal conductivity bumps 136 and 138 respectively which extend from the component 130. Other electronic points of the component 130 are connected by electrically conductive bumps 140 and 142 which extend from the component 130 and contact pads 144 and 146 formed on the structure 124 to the metallization pattern in the structure 124. Further illustrated is an LTCC sheet 148 which corresponds to the sheet 110 of the package 80.

Although only one flip-chip component 130 is illustrated as being mounted on the package 120 in FIG. 5, any number of the same or different components can be provided. FIG. 5 illustrates the general capability of selectively connecting one portion of the component 130 to the metallization pattern in the dielectric structure 124, and another portion of the component 130 to the heat sink 128.

Figure 7:
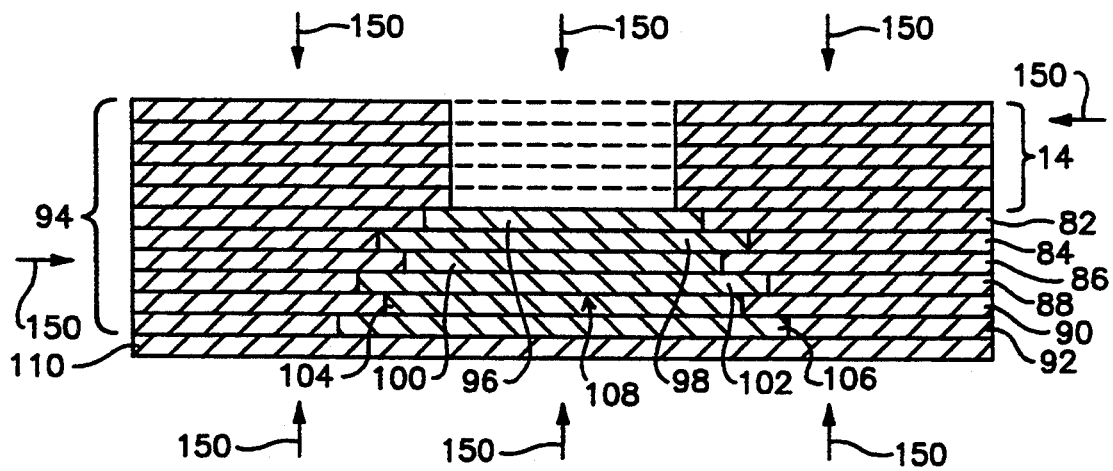
FIGS. 6 and 7 are simplified sectional views illustrating a method of fabricating the package illustrated in FIG. 4.
Figure 6:
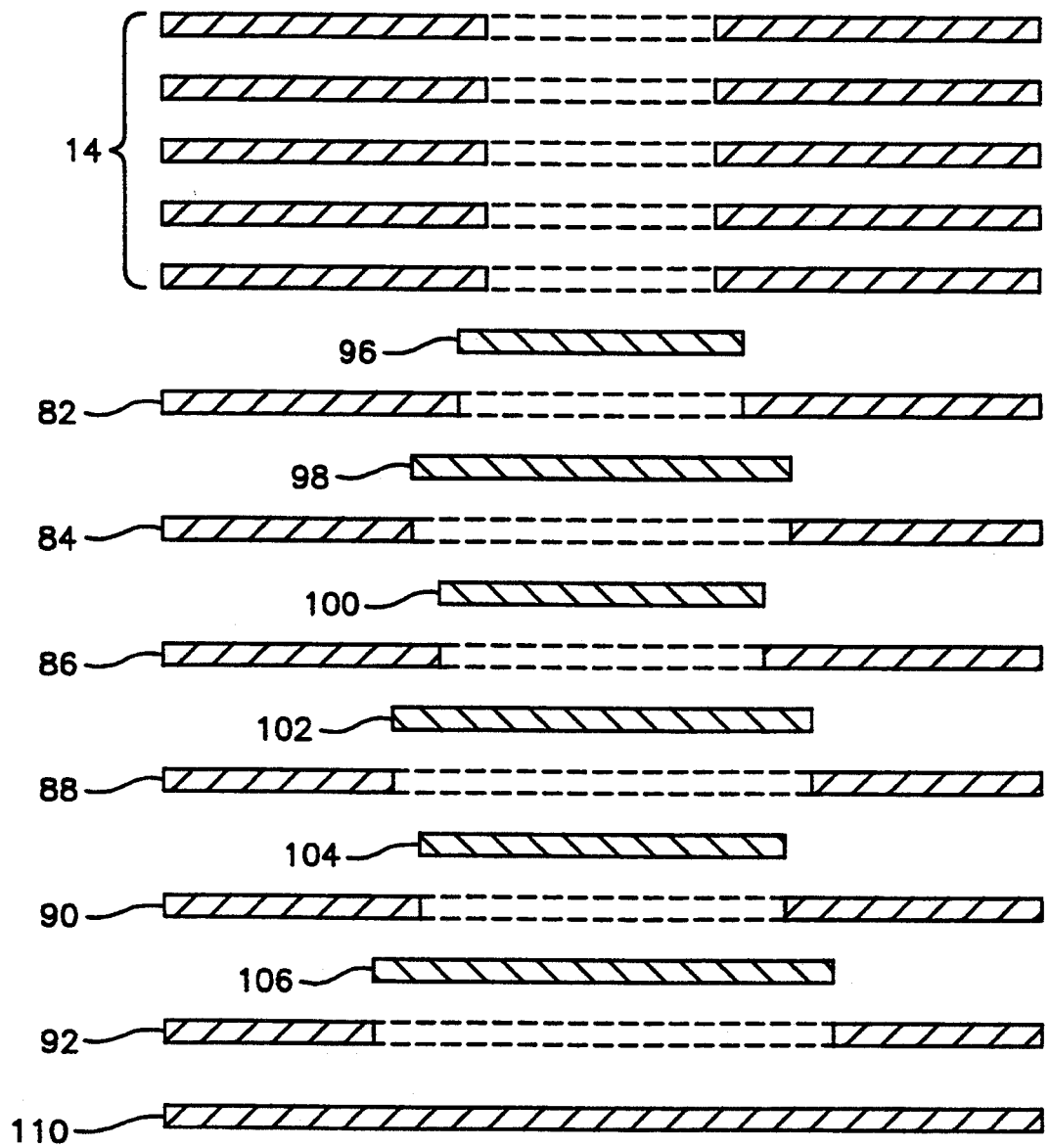

FIGS. 6 and 7 illustrate a method of fabricating a monolithic microelectronic circuit package in accordance with the present invention. These figures illustrate the fabrication of the package 80 of FIG. 4 by way of example, but the method is essentially similar for all embodiments of the invention.

In FIG. 6, the low thermal conductivity sheets 14 and 82 to 92 are cut to the correct size and shape, including the holes for the heat sink 108. The required metallization patterns, resistors and other circuit elements are formed on the surfaces of the sheets 14 and 82 to 92. The high thermal conductivity sheets 96 to 106 are also cut to size, with their shapes being the same as the holes in the sheets 82 to 92 respectively.

As illustrated in FIG. 7, the sheets 14, 82 to 92 and 96 to 106 and 110 (if provided) are stacked together, with the sheets 96 to 106 being disposed in the holes of the sheets 82 to 92 respectively. The stacked assembly laminated, baked at approximately 450° C. to burn out the organic binders in the LTCC tape, and then cofired approximately 850° C. to fuse or sinter the sheets together to form a multilayer monolithic structure with the heat sink 108 as an in-situ element. After cofiring, the substrate 24 and component 28 are added to produce the package 80 illustrated in FIG. 4.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

I claim:

1. A monolithic microelectronic circuit package, comprising:
    a dielectric structure including a plurality of stacked low thermal conductivity sheets of low-temperature-cofired-ceramic (LTCC) tape with a hole formed therethrough; and a heat sink including a plurality of stacked high thermal conductivity sheets of LTCC tape disposed in said hole, wherein said dielectric structure and said heat sink are cofired together to form an in-situ monolithic package, said heat sink having laterally continuous high thermal conductivity.

2. A package as in claim 1, in which said plurality of stacked high thermal conductivity sheets of the heat sink comprises:

a low thermal conductivity ceramic material; and a high thermal conductivity material dispersed in said low thermal conductivity ceramic material.

3. A package as in claim 1, in which said plurality of stacked high thermal conductivity sheets of the heat sink is electrically conductive.

4. A package as in claim 3, in which said plurality of stacked high thermal conductivity sheets of the heat sink comprises a high thermal conductivity material selected from the group consisting of silver, gold, copper and matrix metals.

5. A package as in claim 1, in which said plurality of stacked high thermal conductivity sheets of the heat sink is electrically insulative.

6. A package as in claim 5, in which said plurality of stacked high thermal conductivity sheets of the heat sink comprises an electrically insulative material selected from the group consisting of aluminum nitride, beryllia and diamond.

7. A package as in claim 1, in which: the heat sink is thinner than the dielectric structure; and said hole comprises:

a first portion in which the heat sink is disposed; and a second portion which opens external of the dielectric structure.

8. A package as in claim 7, further comprising a heat generating electrical component which is mounted on and thermally contacts the heat sink in said second portion of said hole.

9. A package as in claim 1, further comprising an electrical component which is mounted on the dielectric structure and has a heat generating portion which thermally communicates with the heat sink.

10. A package as in claim 9, further comprising a high thermal conductivity bump for thermally connecting said heat generating portion of the component to the heat sink.

11. A package as in claim 10, in which:

said plurality of stacked high thermal conductivity sheets of the heat sink is electrically conductive; and said bump is electrically conductive.

12. A package as in claim 11, further comprising a thermally and electrically conductive substrate on which the dielectric structure is mounted such that the heat sink thermally and electrically communicates with the substrate.

13. A package as in claim 9, in which the electrical component is a microelectronic flip-chip.

14. A package as in claim 1, further comprising a high thermal conductivity substrate on which the dielectric structure is mounted such that the heat sink thermally communicates with the substrate.

15. A package as in claim 14, in which:

the substrate is electrically conductive;

said plurality of stacked high thermal conductivity sheets of the heat sink is electrically conductive; and the heat sink electrically communicates with the substrate.

16. A package as in claim 14, in which:

the substrate is electrically conductive;

said plurality of stacked high thermal conductivity sheets of the heat sink is electrically conductive; and the package further comprises an electrically insulative layer disposed between the heat sink and the substrate.

17. A package as in claim 14, in which: the heat sink has a cross-sectional area which decreases away from the substrate.

18. A package as in claim 1, in which:

at least two of said plurality of stacked high thermal conductivity sheets of the heat sink comprise first sheets having a first lateral shape and at least two others of said plurality of high thermal conductivity sheets of the heat sink comprise second sheets having a second lateral shape, wherein said first sheets and said second sheets are stacked together such that said first and said second sheets alternate in said stack; and said hole in said dielectric structure has a plurality of shapes which are substantially the same as said first and said second lateral shapes of said first and said second sheets of the heat sink respectively.

19. A package as in claim 1, in which said sheets of the dielectric structure and said sheets of the heat sink have substantially the same thermal shrinkage characteristics.

* * * * *